United States Patent [19]

Holdeman et al.

[11] 4,227,096
[45] Oct. 7, 1980

[54] MICROWAVE INTEGRATED CIRCUIT FOR JOSEPHSON VOLTAGE STANDARDS

[76] Inventors: Robert A. Frosch, Administrator of the National Aeronautics and Space Administration, with respect to an invention of Louis B. Holdeman, Boyds; Jaan Toots, Gaithersburg, both of Md.; Chu-Cheng Chang, Kowloon Tong, Hong Kong

[21] Appl. No.: 938,298

[22] Filed: Aug. 31, 1978

[51] Int. Cl.³ ............................................. G01R 23/06
[52] U.S. Cl. ................................. 307/233 R; 307/306; 333/204
[58] Field of Search .......................... 307/233 R, 306; 328/140, 141; 333/246, 204

[56] References Cited

U.S. PATENT DOCUMENTS

| 3,696,287 | 10/1972 | Silver et al. | 307/306 X |
| 3,736,527 | 5/1973 | Longacre, Jr. | 307/306 X |

*Primary Examiner*—John Zazworsky
*Attorney, Agent, or Firm*—G. J. Porter; J. R. Manning; L. D. Wofford, Jr.

[57] ABSTRACT

A microwave integrated circuit, comprised of one or more Josephson junctions and short sections of microstrip or stripline transmission line, is fabricated from thin layers of superconducting metal on a dielectric substrate. The short sections of transmission line are combined to form the elements of the circuit, and particularly, two microwave resonators. The Josephson junctions are located between the resonators, and the impedance of the Josephson junctions forms part of the circuitry that couples the two resonators. The microwave integrated circuit has an application in Josephson voltage standards. In this application, the device is asymmetrically driven at a selected frequency (approximately equal to the resonance frequency of the resonators), and a D.C. bias is applied to the junction. By observing the current-voltage characteristic of the junction, a precise voltage, proportional to the frequency of the microwave drive signal, is obtained.

6 Claims, 5 Drawing Figures

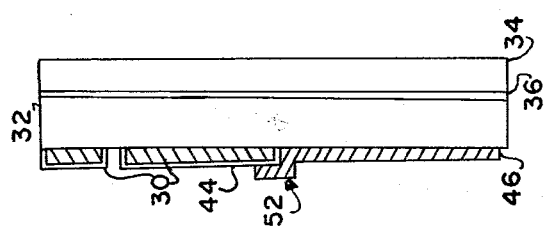
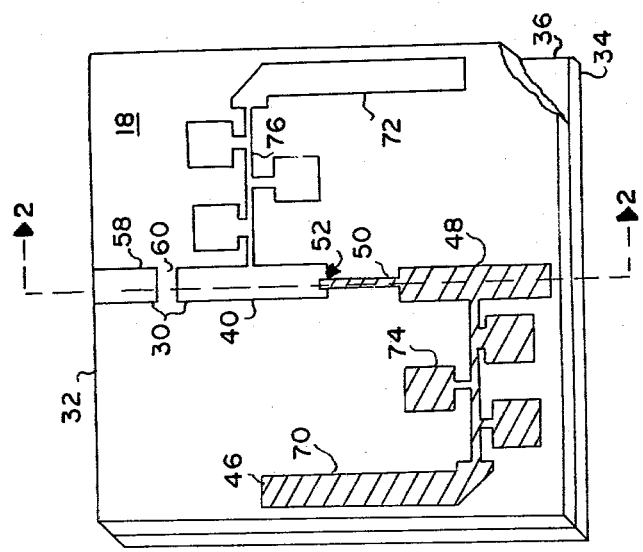

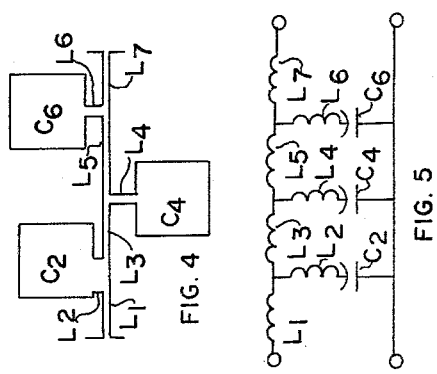
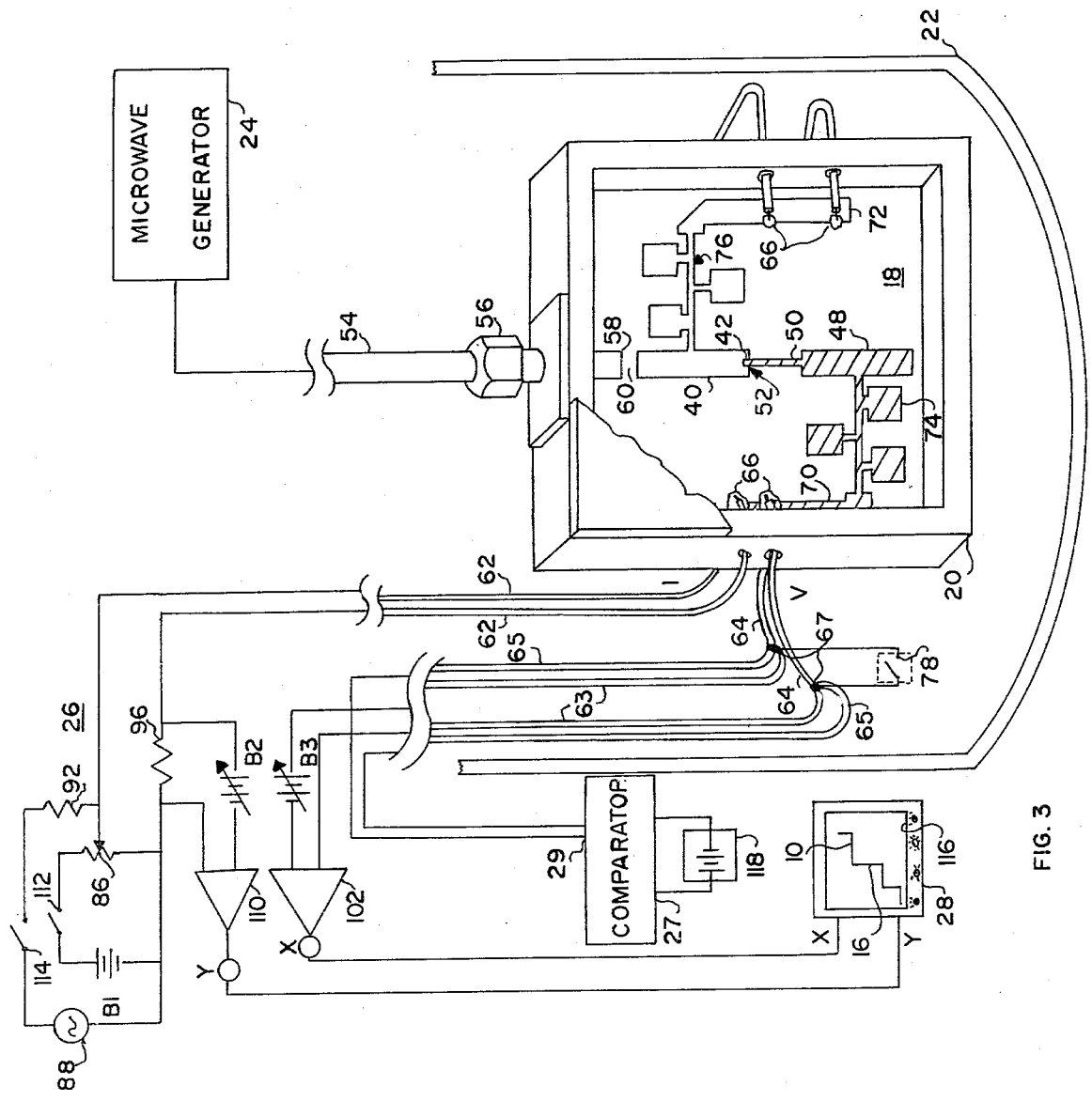

MICROWAVE INTEGRATED CIRCUIT FOR JOSEPHSON VOLTAGE STANDARDS

ORIGIN OF THE INVENTION

The invention described herein was made in the performance of work under a NASA contract and is subject to the provisions of Section 305 of the National Aeronautics and Space Act of 1958, public law 85-568 (72 STAT 453; 42 U.S.C. 2457).

BACKGROUND OF THE INVENTION

1. Field of the Invention

This invention relates to voltage standards, and particularly to a voltage standard wherein a precise voltage is obtained by observation of the voltage-current characteristic of a Josephson junction across which is applied a microwave signal of a precisely known frequency.

2. General Description of the Prior Art

It has been previously determined that when a Josephson effect device, or Josephson junction, is D.C. biased and irradiated with microwaves of a precisely known frequency, a series of very accurate steps are induced into the D.C. voltage-current characteristic of the junction, enabling it to be used as a precision frequency-to-voltage converter. The spacing between the steps is exactly $(h/2e)f$, where h is Planck's constant, e is the fundamental unit of charge (i.e., the charge on an electron), and f is the frequency of the applied microwaves. Accordingly, on July 1, 1972 (NBS Tech. News Bull. 56, 159), the National Bureau of Standards redefined the U.S. legal volt by assigning the value $2e/h = 483593.420$ GHz/$V_{NBS}$, and since that date, the U.S. volt has been maintained via the A.C. Josephson effect. The apparatus used for the routine maintenance of the U.S. volt consists of (1) two series-connected Pb-Pb oxide-Pb tunnel junctions producing a 10 mV output, (2) a special 100:1 voltage comparator utilizing two interchangeable Hamon networks, and (3) a tunable microwave system operating near 9 GHz (B. F. Field, T. F. Finnegan, and J. Toots, Metrologia 9, 155 (1973)). The Josephson junctions are positioned in a waveguide which is immersed in liquid helium. The current through the individual junctions and the applied microwave power are independently adjusted to produce a constant voltage near 10 mV, which is compared to a Weston-type standard cell with an emf near 1 V using the comparator; the frequency of the applied microwave radiation is then adjusted until the voltage drop across the two series-connected junctions is exactly 1/100 of the emf of the standard cell. The precision and estimated accuracy with which the U.S. volt can be maintained with this system are within about 0.02 ppm and 0.04 ppm, respectively (one standard deviation estimates). However, the working voltage standard routinely used throughout the United States is still the Weston-type cadmium sulfate standard cell, which has a very stable emf of about one volt. In order to calibrate these working voltage standards in terms of the U.S. volt using the calibration services provided at present by NBS, there is required the transportation of standard cells to and from the NBS volt facility at Gaithersburg, Maryland. In principle, this shipping of standard cells is unnecessary, since a voltage can be produced directly in terms of the U.S. legal volt by irradiating a Josephson junction with microwaves of known frequency and using the assigned value of $2e/h$. In actual practice, however, rather sophisticated instrumentation is required in order to ensure the conditions under which the microwave-induced steps in the current-voltage characteristic of the Josephson junction are constant-voltage steps and to step up the voltage from junction voltages (a few millivolts) to the one volt level needed for calibration work in industrial laboratories, i.e., to the level of the emf's produced by Weston-type standard cells. Thus, an adequate and economical frequency-to-voltage converter is required if the obvious needs are to be met. The system now employed by NBS as a master standard would be too expensive to duplicate, and that system would require an operator who is highly skilled in cryogenic and microwave techniques in addition to the skills required for standard cell calibration. To be economically practical, a Josephson voltage standard for general usage must incorporate a fixed-frequency microwave source and a simplified comparator network in order to reduce overall cost, and its operation should not require special skills and training in cryogenic techniques and microwave engineering. Accordingly, the National Bureau of Standards has developed an instrument which incorporates a fixed-frequency microwave source and a simplified comparator network to serve as a prototype for a Josephson voltage standard for general usage (B. F. Field and V. W. Hesterman, IEEE Trans. Instrum. Meas. IM-25, 509 (1976) and L. B. Holdeman, B. F. Field, J. Toots, and C. C. Chang, Proc. Conf. on Future Trends in Superconductive Electronics (to be published)).

In developing a frequency-to-voltage converter for a Josephson voltage standard for general usage, problems had to be solved to provide a device with the following capabilities if the general usage instrument was to be successful:

1. That the device produce useable constant-voltage steps at sufficiently high voltages to give adequate precision (within one part-per-million or better at the one volt level) with simplified potentiometer devices.

2. That the device be capable of operation at a fixed frequency to accommodate relatively inexpensive solid-state microwave sources which operate at a single frequency.

3. That the device be capable of operation at low rf power inputs to accommodate the aforementioned inexpensive microwave sources, which conventionally deliver a maximum of 50 milliwatts of power.

4. That the device be operable at the normal boiling point of a liquid helium bath.

5. That the device not require adjustment, such as frequency trim, while at liquid helium temperatures.

SUMMARY OF THE INVENTION

In accordance with the invention, a Josephson junction is connected between two resonant devices, and one of the resonant devices is supplied a microwave signal corresponding closely to the resonant frequency of the resonant devices. A variable D.C. bias is applied through the resonant devices and across the junction, and the current-voltage responsive characteristic of the junction of the applied microwaves and bias is observed. By observation, a voltage is selected which is precisely related to the frequency of the microwave source and may be employed as a secondary voltage standard.

Preferably, a microwave integrated circuit would incorporate Josephson junctions and have application in precise voltage standards and voltage calibrators, comprised of a supporting substrate of a specified thickness and relative dielectric constant, a metal plate beneath the substrate and forming the ground plane for the microwave integrated circuit, and a first layer of superconductive material carried on the substrate. In a preferred embodiment of the invention, the first superconductive layer is oxidized, and a second superconductive layer is carried on the substrate, the second layer overlapping the first layer to form a Josephson tunnel junction in the overlap region. The superconductive materials carried on the substrate are formed into patterns which, together with the ground plane, comprise sections of microstrip transmission line for propagating microwave radiation. In accordance with this invention, sections of the microstrip transmission line form two resonant structures which build up the rf amplitude applied from a low-power microwave source to the level required to produce constant-voltage steps in the current-voltage characteristic of the aforementioned Josephson tunnel junction at voltage levels of about 5 millivolts, and it is an object of this invention that the impedance of the Josephson junction forms part of the circuitry coupling the two resonant structures, so that the radiation is also efficiently coupled to the supercurrents in the Josephson junction.

Another important object of this invention is the method of adjusting the operating frequency of the microwave integrated circuit by anodizing the metal plate used as the ground plane, to adjust the effective dielectric constant of the material between the superconductive materials carried on the substrate and the metal ground plane.

Yet another object of this invention is a preferred embodiment wherein the exact location of the Josephson junction relative to the one of the two resonator strips is an important consideration in device performance, and wherein the size, shape, and orientation of the junction relative to said resonator is important to the performance of the device.

BRIEF DESCRIPTION OF THE DRAWINGS

FIG. 1 is a schematic view of an embodiment of a Josephson junction microwave integrated circuit as contemplated by this invention.

FIG. 2 is a cross-sectional view of the microwave integrated circuit in the area of the Josephson junction.

FIG. 3 is a schematic view of an embodiment of this invention, together with a typical circuitry arrangement for selectively biasing and operating the invention in Josephson voltage standards.

FIG. 4 is a schematic view of the thin-film filter incorporated into the thin-film leads to the Josephson junction.

FIG. 5 is a schematic view of the lumped-element prototype for the thin-film filter.

DESCRIPTION OF A PREFERRED EMBODIMENT

The present invention utilizes one or more Josephson junctions of the thin-film type. Basically, a Josephson junction consists of two bulk superconductors connected by a "weak link". This situation has been realized in a variety of constructions, for example, two bulk superconductors separated by a very small spacing, usually an insulator formed by growing an oxide layer of approximately 2 or 3 nanometers thickness on the surface of one of the superconductors. Alternately, a "microbridge" can be used wherein two large areas joined by a very small bridge are fabricated in a thin superconducting film. Collectively, all such superconducting "weak links" are referred to as "Josephson junctions" when they exhibit the well-known effects known as "the Josephson effects". While the preferred embodiment described below incorporates a single Josephson tunnel junction (comprised of two thin superconducting films separated by a thin oxide layer grown on one of them), it is to be understood that other numbers and types of junctions may be employed without departing from the spirit or scope of the invention.

FIG. 1 illustrates an embodiment of a Josephson junction microwave integrated circuit as contemplated by this invention. Integrated circuit 18 is formed by depositing (e.g., by evaporating in vacuum) lead (Pb) films 30 and 46 through stencil masks (not shown) onto a one inch square by 0.032 inch thick glass substrate 32 having a relative dielectric constant of about 5 to 6 (e.g., Corning 7059 glass). The deposited films are approximately 100 to 200 nm thick.

Aluminum plate 34, in general having a thin anodized layer 36 (FIG. 2), is secured to the bottom surface of substrate 32. Aluminum plate 34 functions as the ground plane for the circuit elements formed by patterns in the deposited lead (Pb) films. Discrete circuit elements are formed in accordance with known technology by the choice of selected widths and lengths of film, generally forming sections of microstrip transmission line of selected impedances.

In order to form a Josephson junction, the lead films on substrate 32 are deposited in three steps:

First, circuit segment 30 is deposited, the upper and right side portion of the circuit as shown in the schematic, this including resonator 40 which is dimensioned to resonate at a frequency that is approximately 1% higher than the frequency selected for operation (e.g., 8.99376 GHz), with an aluminum ground plane having a chemically clean surface against the underside of substrate 32. (The reasons for dimensioning resonator 40 to resonate at this particular frequency will be made clear in succeeding paragraphs.)

Next, the surface of lead film 30 is oxidized by one of several well-known techniques; the particular oxidation procedure used in fabricating the devices for this embodiment will be described briefly. Substrate 32 carrying lead film 30 is heated to approximately 40% Celsius, and oxygen is admitted to the vacuum chamber to attain a pressure of about half an atmosphere, so that an oxide layer 44 (FIG. 2) is formed on the surface of lead film 30. After approximately 20 minutes of oxidation, the oxygen is pumped out of the deposition chamber and good vacuum achieved.

Next, the remainder of the circuit, film segment 46, including the formation of second resonator 48, fabricated so as to have approximately the same resonance frequency as resonator 40, is deposited onto substrate 32. A short section of high-impedance microstrip transmission line 50 extends from resonator 48 to overlap resonator 40, and there is thereby completed a Josephson tunnel junction 52 between strip 50 and resonator 40, and thereby between resonators 40 and 48. The junction is thus formed of Pb/PbO/Pb (lead-lead oxide-lead). Preferably, the junction has a dimension along the length dimension of resonator 40 which is smaller than the dimension normal to the length dimension. For example, the former dimension would typically be approximately 75 micrometers, and the latter dimension approximately 130 micrometers (i.e., approximately 0.003 inch by 0.005 inch).

Although in the preferred embodiment described above, lead film 30 is evaporated first and oxidized, after which lead film 46 is evaporated, alternatively lead film 46 can be evaporated first, then oxidized, after which lead film 30 can be evaporated. Additionally, other superconducting materials (e.g., niobium), other oxidation techniques (e.g., oxidation by an oxygen plasma), and other methods of producing the patterns (e.g., by photolithographic procedures instead of deposition through stencil masks) may be employed without departing from the spirit or scope of the invention.

FIG. 3 shows a schematic view of the microwave integrated circuit in a typical Josephson voltage standard application. Integrated circuit 18 is mounted in a closed metal box 20 (for rf shielding) and immersed in liquid helium in container 22. This arrangement effects an operating temperature for the circuit of 4° Kelvin to thus enable its necessary superconductive mode of operation.

Microwave generator 24 provides a selected output frequency $f_o$ (e.g., 8.99376 GHz) and is mounted outside container 22, as are bias supply 26, comparator 27, and oscilloscope 28. Microwave power from microwave generator 24 is routed to integrated circuit 18 through coaxial cable 54 which feeds a coax-to-microstrip converter 56. Converter 56 couples to a short section of microstrip transmission line 58 which is separated from the end of resonator 40 by a gap 60, and thereby section of microstrip line 58 is capacitively coupled to resonator 40. In this fashion, microwave energy is transferred to resonator 40. The strength of this capacitive coupling, i.e., the width of gap 60, determines the loaded Q of resonator 40, the quality factor Q being larger for larger gap.

The rf amplitude is built up in proportion to Q, but the frequency range about the resonance frequency f in which the rf amplitude is built up is proportional to f/Q. For Q too large, matching the resonator frequency f to the frequency $f_o$ of the microwave generator is difficult, and also the circuit may be overly sensitive to small variations in rf power input since the size of the microwave-induced steps in the current-voltage characteristic of the Josephson junction is a function of the applied microwave power. By selection of an appropriate value for the width of gap 60, a value of Q that is appropriate to the given experimental situation can be selected. For example, a gap of 50 micrometers (0.002 inch) gives Q values of about 1,000, a good value for use in the Josephson voltage standard intended for general usage. For a Q value of 1,000, f/Q=0.001 f, which means the resonance frequency of the resonators must be the same as the frequency $f_o$ of the microwave generator to within about 0.1% of $f_o$. However, the as-fabricated integrated circuits 18 have resonance frequencies which vary about the design frequency, the scatter being about 1% of the design frequency, so that a means of individually adjusting the frequency of each circuit is needed. This is the purpose of anodized layer 36 on aluminum ground plane 34.

The resonance frequency of a half-wavelength resonator depends in part on the relative dielectric constant of the dielectric material between the resonator strip and the ground plane, i.e., of substrate 32. If a thin sheet of a material with a different dielectric constant is placed between substrate 32 and ground plane 34, the resonance frequency of the resonator will be shifted; if the thin sheet has a lower dielectric constant than the substrate, the resonance frequency will increase; and if the thin sheet has a higher dielectric constant than the substrate, the resonance frequency will decrease. The magnitude of the change will depend on the thickness of the thin sheet for a given relative dielectric constant. The anodic oxides formed on aluminum alloys have dielectric constants in the range 7–10 as compared to a relative dielectric constant of 5–6 for the substrate glass, so that anodizing aluminum ground plane 34 will lower the resonance frequency of the device, about 3% for an anodic oxide about 25 micrometers (0.001 inch) thick. For most aluminum alloys, the thickness of the anodic oxide layer formed in a sulphuric acid electrolyte is proportional to the electrical charge passed during anodization, so that for constant-current anodization, the thickness of the oxide layer increases linearly in time. Thus, the resonance frequency of each circuit is measured relative to a ground plane with a clean metal surface, and its deviation from the operating frequency thereby determined. Since the design frequency is about 1% higher than the operating frequency, the resonance frequencies of the majority of the circuits can be adjusted to the operating frequency by anodizing the ground plane for each circuit an appropriate length of time.

Direct current bias is supplied from bias system 26 down silicon-copper leads 62. Leads 62 are attached to contact pads 70 and 72 on substrate 32 with an indium-alloy solder 66. Contact pad 70 is connected through low-pass filter 74 to a midpoint of resonator 48, and contact pad 72 is connected through a like low-pass filter 76 to a like midpoint of resonator 40. Low-pass filters 74 and 76 function to effect high-attenuation paths at the microwave operating frequency between resonators 40 and 48 and pads 72 and 70, respectively, and thus inhibit any exiting of rf energy through current leads 62 or voltage leads 64. Contact pads 70 and 72 are formed from sections of 50 ohm microstrip transmission line, and hence properly terminate low-pass filters 74 and 76.

Low-pass filters 74 and 76 are identical and are formed, in accordance with previously developed thin-film technology, to simulate lumped impedance type filters. Illustrative of the analog relationship, FIG. 4, showing one of the filters, has components labelled correspondingly with those of their counterparts, conventional lumped type impedance elements illustrated in FIG. 5. Actually, since the microstrip components are distributed elements only approximating the lumped elements, the capacitance of inductive elements and the inductance of the capacitive elements must be taken into account, and the correspondence is not one-to-one; the distributed element which gives the major contribution to the approximation of a given lumped element is labelled as corresponding to the lumped element.

D.C. bias circuit 26 functions to provide a current input to Josephson junction 52 formed by the oxide layer between resonator 40 and transmission line 50. Basically, D.C. current through Josephson junction 52 is provided by battery B1 and adjusted by means of potentiometer 86. The current through Josephson junction 52 is proportional to the potential drop across resistor 96, which is amplified by amplifier 110 for display on oscilloscope 28; adjustable offset voltage from B2 permits amplification of higher voltages proportional to higher current values. In addition, an alternating current source 88 permits a sweep of the current about the D.C. current level provided by battery B1 and potentiometer 86, thereby facilitating observation of the step structure in the current-voltage characteristic during setup.

For the application of the circuit to the Josephson voltage standard for general usage, two sets of voltage leads are provided as shown: a set of copper leads 65 connected to comparator 27, and a set of silicon-copper leads 63 connected to amplifier 102. The potential drop across Josephson junction 52 produced by current from bias supply 26 is amplified by amplifier 102 for display on oscilloscope 28; adjustable offset voltage from B3 permits amplification of large signals.

Referring again to FIG. 3, there is shown on screen 116 of oscilloscope 28 a trace 10 of a portion of the current-voltage characteristic of the Josephson junction 52; the trace shown was taken for the device in actual application in a prototype for a Josephson voltage standard instrument for general usage. Vertical step 16, shown at the center of screen 116 of oscilloscope 28, is the n=279 step induced by an applied microwave signal at the frequency 8.993755 GHz and occurs at a voltage of 5.188776 mV; and the height of the step shown is approximately 28 microamperes; the spacing between constant-voltage steps is 18.59777 microvolts in accordance with $2e/h = 483593.420$ GHz/$V_{NBS}$. Voltage leads 64 between connections 67 of voltage leads 63 to voltage leads 65 and contact pads 70 and 72 are superconducting so that no thermal emf's are produced therein; however, thermal emf's are produced in copper leads 65 so that at the connection of these leads to comparator input 29, there appears a voltage equal to the thermal emf plus the exact voltage 5.188776 mV produced by Josephson junction 52. Therefore, for use with the comparator described by B. F. Field and V. W. Hesterman, IEEE Trans. Instrum. Meas. IM-25, 509 (1976), there is provided a superconducting shorting switch 78 operated by means of a control rod (not shown) from outside of container 22; when superconducting switch is closed, only the thermal emf's developed in copper leads 65 appear at input 29 of comparator 27; and in the aforementioned comparator of Field and Hesterman, there is provided circuitry to null this thermal emf. Thus, when switch 78 is opened, there is effected in comparator 27 only the exact Josephson voltage 5.188776 mV, which is compared with the emf of a Weston-type standard cell 118 by means of circuitry in said comparator, thereby effecting calibration of standard cell 118.

Oscilloscope trace 10, as shown in FIG. 3 on screen 116 of oscilloscope 28, is effected by the alternating current from current source 88; and the D.C. current provided by battery B1 is adjusted by means of potentiometer 86 until trace 10 is symmetric about the midpoint of constant-voltage step 16, thereby adjusting the D.C. current to the midpoint of step 16. The alternating current source is disconnected after this adjustment so that on screen 116 of oscilloscope 28 there appears a dot at the midpoint of step 16 that had been previously observed in trace 10. Since the voltage produced across junction 52 was constant for all current values on the step, the voltage output therefore remains constant despite fluctuations in current about the bias point, provided the amplitude of such current fluctuations is smaller than half the step height. Without sufficient microwave power input, however, the constant-voltage steps are not observed when the junction is biased to the desired voltage so that current fluctuations result in voltage fluctuations; also, it is not possible to obtain exact voltages without the microwave-induced steps. Resonators 40 and 48 build up the rf amplitude from a low power microwave generator, but it is still necessary to efficiently couple the available power to Josephson junction 52. This is accomplished by making the junction part of the circuitry coupling resonator 40 to resonator 48 so that the microwave energy transferred between the two resonators is transferred through the junction. For the preferred embodiment described herein, the microwave power input required to produce constant voltage steps at 5.2 mV was less than one milliwatt at the resonance frequency, with more power required off resonance according to the Q of the resonators.

By means of the present invention as described above, there is provided an extremely accurate frequency-to-voltage converter voltage standard which is capable of meeting the aforesaid objects. It actually requires less than one milliwatt of power for operation, and the heat leak to the cryogenic environment container 22 from D.C. and rf connections is very small. The structure is sufficiently simple and reproduceable to be made by standard integrated circuit techniques. It is simply tuned by fine tuning of the resonators, which is simply achieved by varying the thickness of the anodized coating 36 on plate 34 which can be controlled extremely accurately by simple time-in-bath techniques. Thus, this apparatus is simply tuned to a single frequency, and thus economical, frequency source. It is adaptable to interface with previously developed potentiometer devices wherein extremely accurate voltage translations can be made between the output of the voltage standard of this invention and chemical cell batteries.

Although the circuit has been described for a Josephson voltage standard for general application, the circuit has other applications. In particular, a version with a lower Q will be used in a new, all-cryogenic Josephson voltage standard under development as a new master standard at NBS. In this instrument, the circuit operates at 7 mV and T=2 Kelvin or below. Also, since Josephson junctions have other applications, such as mixers, radiation detectors, etc., it is recognized that this circuit, or simple modifications thereof, may find application in these areas.

Having thus disclosed our invention, what is claimed is:

1. A Josephson junction type voltage standard comprising:
   first and second electrical resonators tuned to resonate at a selected, like, frequency;
   a Josephson junction connected electrically between said resonators;
   coupling means for coupling a signal of said selected frequency to at least one of said resonators;
   a D.C. series circuit comprising a low-pass filter, a variable potential D.C. junction bias source, and said resonators for applying a selectable bias to said Josephson junction; and
   means coupled to said series circuit for detecting the current-voltage characteristic of said Josephson junction, whereby a precise voltage related to said frequency may be determined.

2. A voltage standard as set forth in claim 1 including:
   an insulating substrate having a planar surface;
   said first and second electrical resonators each comprise an elongated thin strip of superconducting material on said surface;

a narrow, with respect to the width of said strips of said resonators, strip of superconductive material positioned on said surface of said substrate and extending from one end of said second resonator and overlapping an end region of said first resonator; and said Josephson junction is formed in a region of overlap between said first resonator and said narrow strip.

3. A voltage standard as set forth in claim 2 wherein:

said strip of said first resonator is directly attached to said substrate; and said narrow strip overlaps said strip of said first resonator.

4. A voltage standard as set forth in claim 2 wherein said substrate includes a second planar surface, opposite to that of said first-named planar surface, and said second planar surface includes a layer of metal.

5. A voltage standard as set forth in claim 4 wherein said metal is of anodizable material and is anodized.

6. A voltage standard as set forth in claim 4 wherein:

said narrow strip extends from said second resonator in a direction parallel with the longitudinal direction of said first resonator; and the dimension of said junction that is thereby in line with the longitudinal dimension of said strip of said first resonator is shorter than the dimension of the junction perpendicular to the longitudinal direction of said strip of said first resonator.

* * * * *